(12) United States Patent
Zheng (10) Patent No.: US 7,797,615 B2
(45) Date of Patent: Sep. 14, 2010

(54) UTILIZING VARIABLE-LENGTH INPUTS IN AN INTER-SEQUENCE PERMUTATION TURBO CODE SYSTEM

(75) Inventor: Yan-Xiu Zheng, Hsinchu (TW)

(73) Assignee: Acer Incorporated, Taipei Hsien (TW)

( * ) Notice: Subject to any disclaimer, the term of this patent is extended or adjusted under 35 U.S.C. 154(b) by 908 days.

(21) Appl. No.: 11/513,158

(22) Filed: Aug. 31, 2006

(65) Prior Publication Data

US 2007/0022353 A1   Jan. 25, 2007

Related U.S. Application Data

(63) Continuation-in-part of application No. 11/414,433, filed on Apr. 28, 2006, and a continuation-in-part of application No. 11/176,829, filed on Jul. 7, 2005.

(51) Int. Cl.
*H03M 13/03* (2006.01)
(52) U.S. Cl. .................. 714/786; 714/702; 714/794
(58) Field of Classification Search ............... 714/786, 714/701, 702, 794, 795; 375/262
See application file for complete search history.

(56) References Cited

U.S. PATENT DOCUMENTS

| | | | |
|---|---|---|---|
| 4,400,768 A | 8/1983 | Tomlinson |
| 4,433,415 A | 2/1984 | Kojima |
| 5,224,100 A | 6/1993 | Lee et al. |
| 5,392,299 A | 2/1995 | Rhines et al. |
| 5,519,734 A | 5/1996 | Ben-Efraim |
| 5,530,707 A | 6/1996 | Lin |

(Continued)

FOREIGN PATENT DOCUMENTS

EP   0 179 401 A2   4/1986

(Continued)

OTHER PUBLICATIONS

Shimizu, S. et al., *A New Addressing Scheme With Reorganizable Memory Structure Basic Principle*. Transactions of the I.E.C.E. of Japan, vol. E65, No. 8, Aug. 1982, pp. 464-471.

(Continued)

*Primary Examiner*—Fritz Alphonse
(74) *Attorney, Agent, or Firm*—Alston & Bird LLP (57) ABSTRACT

The present invention relates to an inter-sequence permutation (ISP) encoder. The ISP encoder comprises: a receiving means to receive an information bit sequence input; a first outputting means for outputting a first code bit output; a second outputting means for outputting a second code bit sequence output; a bit-adding means coupled to the receiving means, the bit-adding means processing the received information bit sequence input prior to any subsequent processing in the ISP encoder; a first convolutional code encoder coupled between the bit-adding means and the first outputting means; a second convolutional code encoder; and an inter-sequence permutation interleaver coupled between the bit-adding means and the second convolutional code encoder. The second convolutional code encoder is coupled between the inter-sequence permutational interleaver and the second outputting means. Further, the ISP encoder comprises a third outputting means coupled to the bit-adding means to output a third code bit output or directly coupled to the receiving means. Alternatively, the ISP encoder comprises a fourth outputting means coupled to the inter-sequence permutation interleaver to output a fourth code bit sequence output.

34 Claims, 6 Drawing Sheets

U.S. PATENT DOCUMENTS

| | | | |
|---|---|---|---|
| 5,729,560 | A | 3/1998 | Hagenauer et al. |
| 5,734,962 | A | 3/1998 | Hladik et al. |
| 5,812,601 | A | 9/1998 | Schramm |
| 5,815,515 | A | 9/1998 | Dabiri |
| 6,014,761 | A | 1/2000 | Lachish et al. |
| 6,023,783 | A | 2/2000 | Divsalar et al. |
| 6,044,116 | A | 3/2000 | Wang |
| 6,182,261 | B1 | 1/2001 | Haller et al. |
| 6,292,918 | B1 | 9/2001 | Sindhushayana et al. |
| 6,373,831 | B1 | 4/2002 | Secord et al. |
| 6,414,988 | B1 | 7/2002 | Ling |
| 6,437,714 | B1 | 8/2002 | Kim et al. |
| 6,477,680 | B2 | 11/2002 | Mujtaba |
| 6,553,516 | B1 * | 4/2003 | Suda et al. ............ 714/702 |
| 6,560,362 | B1 | 5/2003 | Piret et al. |
| 6,560,748 | B2 | 5/2003 | Li |
| 6,571,369 | B1 | 5/2003 | Li |
| 6,578,170 | B1 | 6/2003 | Piret et al. |
| 6,603,412 | B2 | 8/2003 | Gatherer et al. |
| 6,618,371 | B1 | 9/2003 | Cao |
| 6,631,491 | B1 | 10/2003 | Shibutani et al. |
| 6,678,843 | B2 | 1/2004 | Giulietti et al. |
| 6,684,365 | B1 | 1/2004 | Murayama et al. |
| 6,697,990 | B2 | 2/2004 | El-Gamal et al. |
| 6,728,927 | B2 | 4/2004 | Crozier |
| 6,745,362 | B1 | 6/2004 | Carlach et al. |
| 6,766,489 | B1 | 7/2004 | Piret et al. |
| 6,845,482 | B2 | 1/2005 | Yao et al. |
| 6,859,906 | B2 | 2/2005 | Hammons et al. |
| 6,903,665 | B2 | 6/2005 | Akhter et al. |
| 6,944,727 | B2 | 9/2005 | Yokokawa |
| 6,957,375 | B2 | 10/2005 | Richardson |
| 6,961,888 | B2 | 11/2005 | Jin et al. |
| 7,058,874 | B2 | 6/2006 | Zhou |
| 7,137,044 | B2 | 11/2006 | Ha et al. |
| 7,155,642 | B2 | 12/2006 | Han |
| 7,180,968 | B2 | 2/2007 | Miyauchi et al. |
| 2002/0159423 | A1 | 10/2002 | Yao et al. |
| 2003/0002474 | A1 | 1/2003 | Alexander et al. |
| 2003/0014715 | A1 | 1/2003 | Lobinger et al. |
| 2003/0041293 | A1 | 2/2003 | Zheng et al. |
| 2003/0058954 | A1 * | 3/2003 | He ............ 375/262 |
| 2003/0154343 | A1 | 8/2003 | Yokokawa |
| 2005/0071727 | A1 | 3/2005 | Zheng et al. |
| 2005/0071728 | A1 | 3/2005 | Zheng et al. |
| 2005/0076286 | A1 | 4/2005 | Zheng et al. |
| 2005/0216700 | A1 | 9/2005 | Honary et al. |
| 2006/0039555 | A1 | 2/2006 | Lee et al. |
| 2007/0011557 | A1 | 1/2007 | Zheng et al. |
| 2007/0255849 | A1 | 11/2007 | Zheng |
| 2009/0077431 | A1 | 3/2009 | Zheng |

FOREIGN PATENT DOCUMENTS

| | | |
|---|---|---|
| EP | 0 313 787 A2 | 5/1989 |

OTHER PUBLICATIONS

Harper, D. T. et al., *Performance Evaluation of Vector Accesses in Parallel Memories Using a Skewed Storage Scheme*, The 13$^{th}$ Annual International Symposium on Computer Architecture, Tokyo, Jun. 1986, pp. 324-328.

Lanynaid, R. N., *Versatile Programmable Logic Array*, IBM Technical Disclosure Bulletin, vol. 25, No. 8, Jan. 1983, pp. 4445-4449.

Berrou, C., et al., *Near Shannon Limit Error—Correcting Coding and Decoding: Turbo-Codes(1)*, IEEE International Conference on Communications ICC '93, 1993, pp. 1064-1070.

Zheng, Y. et al., *Inter-Block Permutation and Turbo Codes*, 3$^{rd}$ International Symp. Turbo Codes and Related Topics, 2003, 44 pages.

Zheng, Y. et al., *Iterative Decoding Algorithm and Terminating Criteria for Inter-Block Permuted Turbo Codes*, The 15$^{th}$ IEEE International Symposium on Personal, Indoor and Mobile Radio Communications (PIMRC 2004), vol. 2, pp. 1116-1120.

Mansour, M., *Unified Decoder Architecture for Repeat-Accumulate and LDPC Codes*, 38$^{th}$, Asilomar Conference on Signals, Systems and Computers, Nov. 2004, pp. 527-531.

3GPP TS 25.212 version 3.1.1, Multiplexing and channel coding [FDD], Dec. 1999.

* cited by examiner

UTILIZING VARIABLE-LENGTH INPUTS IN AN INTER-SEQUENCE PERMUTATION TURBO CODE SYSTEM

The present application is a continuation-in-part application of U.S. application Ser. No. 11/176,829, filed on Jul. 7, 2005 which is entitled "AN INTER-SEQUENCE PERMUTATION TURBO CODE SYSTEM AND OPERATION METHODS THEREOF," and U.S. application Ser. No. 11/414,433, filed on Apr. 28, 2006 which is entitled "NETWORK FOR PERMUTATION OR DE-PERMUTATION UTILIZED BY CHANNEL CODING ALGORITHM."

BACKGROUND OF THE INVENTION (A) Field of the Invention

The present application relates to a method of utilizing variable-length inputs in an inter-sequence permutation turbo code system.

(B) Description of Related Art

In U.S. application Ser. No. 11/176,829 and U.S. application Ser. No. 11/414,433, an improved turbo code system is disclosed. However, persons skilled in the art may have noted that the ability of this system is limited. When all the sequence permuters (the first sequence permuter or the second sequence permutor in U.S. application Ser. No. 11/176,829) permute sequences with the same length, the system can only deal with inputted sequence (at encoder side) having the length of information bit sequence dividable to the length processed by the permuter without any remainder. However, this limit is undesired since practically information bit sequence can be of any length. The present invention is thus a solution to this problem and a teaching in utilizing an inputted sequence with variable-length in the inter-sequence permutation (ISP) turbo code system. The method can be further applied for the turbo code applying the almost regular permutation (ARP) interleaver, which is another kind of the inter-sequence permutation interleaver.

SUMMARY OF THE INVENTION

The present invention relates to an inter-sequence permutation (ISP) encoder. The ISP encoder comprising a receiving means for receiving an information bit sequence input; a first outputting means through which a first code bit sequence output is outputted; a second outputting means through which a second code bit sequence output is outputted; a bit-adding means coupled to the receiving means, the bit-adding (symbol-adding) means processing the received information bit sequence input prior to any subsequent processing in the ISP encoder; a first convolutional code encoder coupled between the bit-adding means and the first outputting means; a second convolutional code encoder; and an inter-sequence permutation interleaver. The inter-sequence permutation interleaver is coupled between the bit-adding means and the second convolutional code encoder. The second convolutional code encoder is coupled between the inter-sequence permutation interleaver and the second outputting means.

Further, the ISP encoder comprises a third outputting means through which a third code bit sequence output is outputted, wherein the third outputting means is coupled to the bit-adding means or directly coupled to the receiving means.

Alternatively, the ISP encoder comprises a fourth outputting means through which a fourth code bit sequence output is outputted, wherein the fourth outputting means is coupled to the inter-sequence permutation interleaver.

The present invention also relates to an inter-sequence permutation encoder. The ISP encoder comprises a receiving means for receiving an information bit sequence input; a first outputting means for outputting a first code bit sequence output; a second outputting means for outputting a second code bit sequence output; a bit-adding means coupled to the receiving means, wherein the bit-adding means processes the received information bit sequence input prior to any subsequent processing of the received information bit sequence input in the inter-sequence permutation encoder; a first convolutional code encoder coupled between the receiving means and the first outputting means; and a second convolutional code encoder coupled to the second outputting means; and an inter-sequence permutation interleaver coupled between the bit-adding means and the second convolutional code encoder. Further, the ISP encoder comprises a third outputting means coupled to the receiving means to output a third code bit sequence output.

Alternatively, the ISP encoder comprises a fourth outputting means coupled to the inter-sequence permutation interleaver to output a fourth code bit sequence output.

BRIEF DESCRIPTION OF THE DRAWINGS

The present invention is described below by way of examples with reference to the accompanying drawings which will make it easier for readers to understand the purpose, technical contents, characteristics and achievement of the present invention, wherein.

DETAILED DESCRIPTION OF THE INVENTION

The detailed description of a preferred embodiment is intended to illustrate the present invention, and is not intended to limit forms to embody the present invention.

Figure 1:
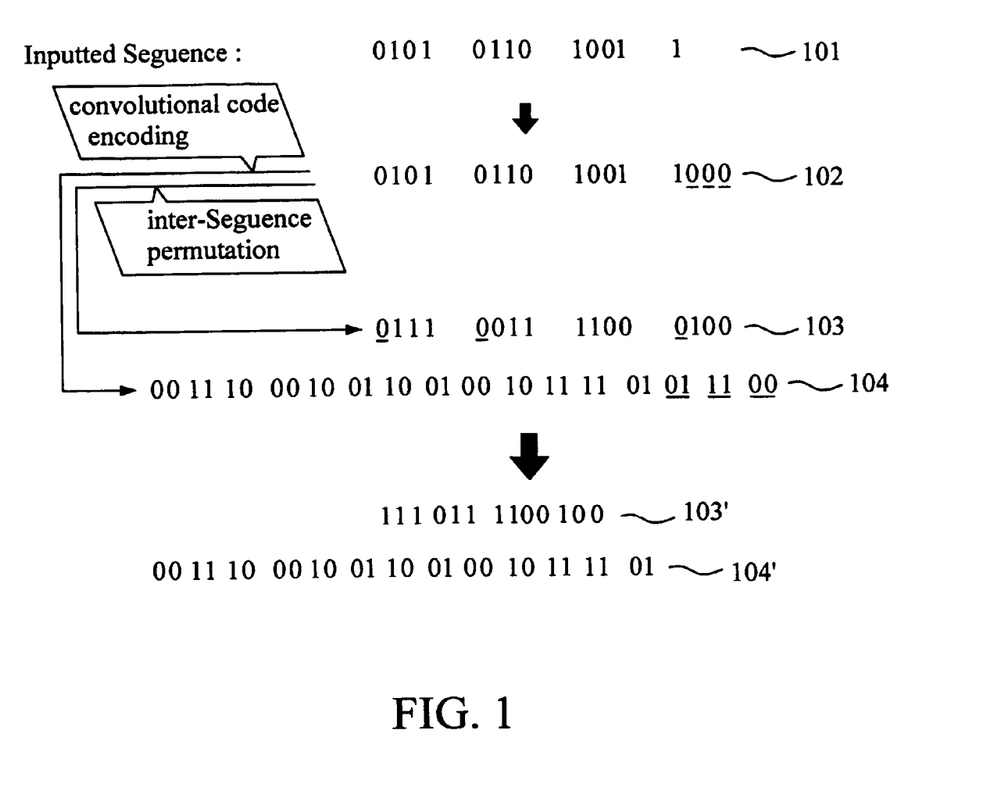
FIG. 1 shows an example illustrating "shortening" and "puncturing" utilized in the ISP turbo code encoder.

Techniques that the invention adopts are conventional "shortening" and "puncturing." Please first refer to FIG. 1. We assume that an inputted, first sequence 101 comprises 13 bits and all the sequence permuters process 4 bits. According to U.S. application Ser. No. 11/176,829 and U.S. application Ser. No. 11/414,433, such a sequence is not a valid sequence input to the ISP turbo code encoder. However, by adding three "0" bits in the sequence 101, it becomes a second sequence 102, which can be divided by 4 without leaving any remainder. Although we add "0" in this case, adding other kinds of symbol is also possible, e.g. "1". Although we add three "0" at the end, exchanging prior information bits with at least one "0" is also possible. Please also note that meanings of "bit" and "symbol" can be interchanged in the present specification. An individual who fully understands the bit-adding operation could realize that adding bits makes the extended length of bit sequence valid for inputting to the inter-sequence permutation interleaver.

The sequence 102 can be permuted and encoded by the encoder performing inter-sequence permutation and convolutional code encoding (both have been discussed in U.S. application Ser. No. 11/176,829), the second sequence 102 becomes a third sequence 103 and a fourth sequence 104. In the third sequence 103 underlined digits in a sequence represent "added" bits. In the fourth sequence 104 underlined digits in a sequence represent "punctured" bits. After the process of inter-sequence permutation and/or convolutional code encoding, the added bits or the punctured bits are taken away, the resulting sequences are a fifth sequence 103' and a sixth sequence 104' respectively.

Adding the added bits before encoding and removing the added bits after encoding is called "shortening." Removing the punctured bits is called "puncturing." The shortening makes that the ISP turbo code system can encode a variable-length information bit sequence encodable when the length of information bit sequence is smaller than the designed length processed by the ISP turbo coding system. The puncturing makes that the length of code bit length matches the desired code bit length and the resultant code rate matches the desired code rate. One would easily note that essentially operations for removing the added bits and removing the punctured bits are very similar; therefore, we will uniformly call them "deleting" in the specification of the present application. However readers should keep in mind that in practice one would use different terms to refer to the deleting operation.

After the added bits are taken away, in order to increase bandwidth efficiency, the outputted "code bit sequences" can be further punctured, individually or jointly. This technique of "further puncturing" has been widely known, and we will just skip detailed description here.

Figure 2:
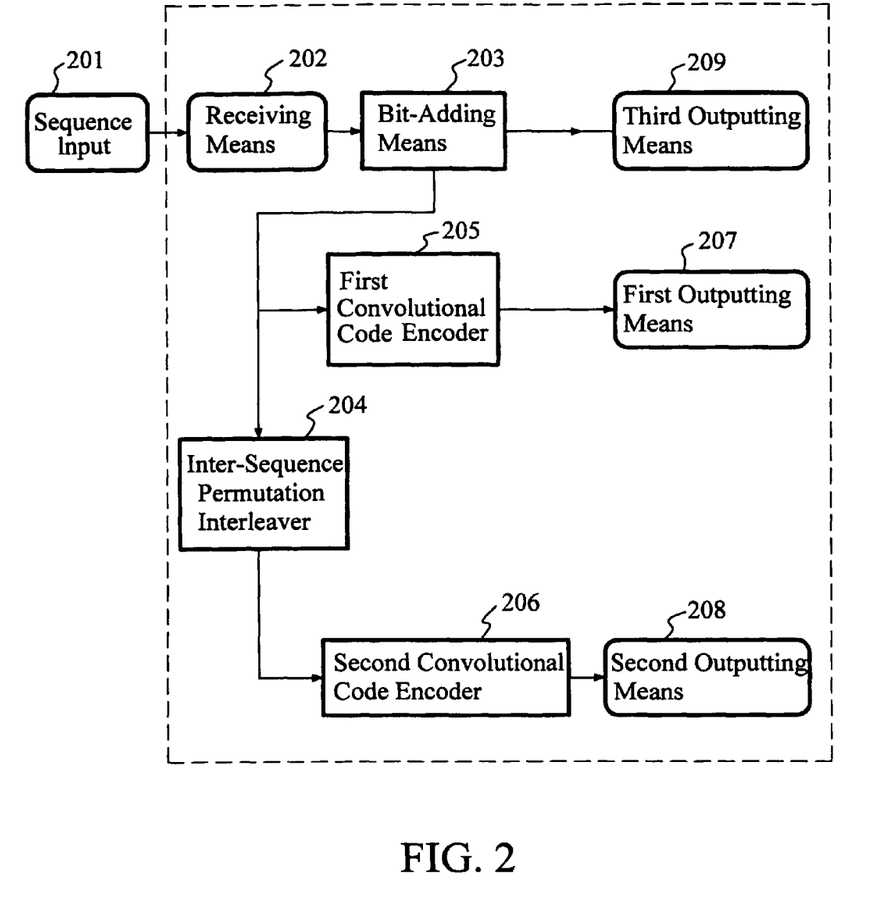
FIG. 2 shows a first embodiment of the ISP encoder of the present invention.
Figure 3:
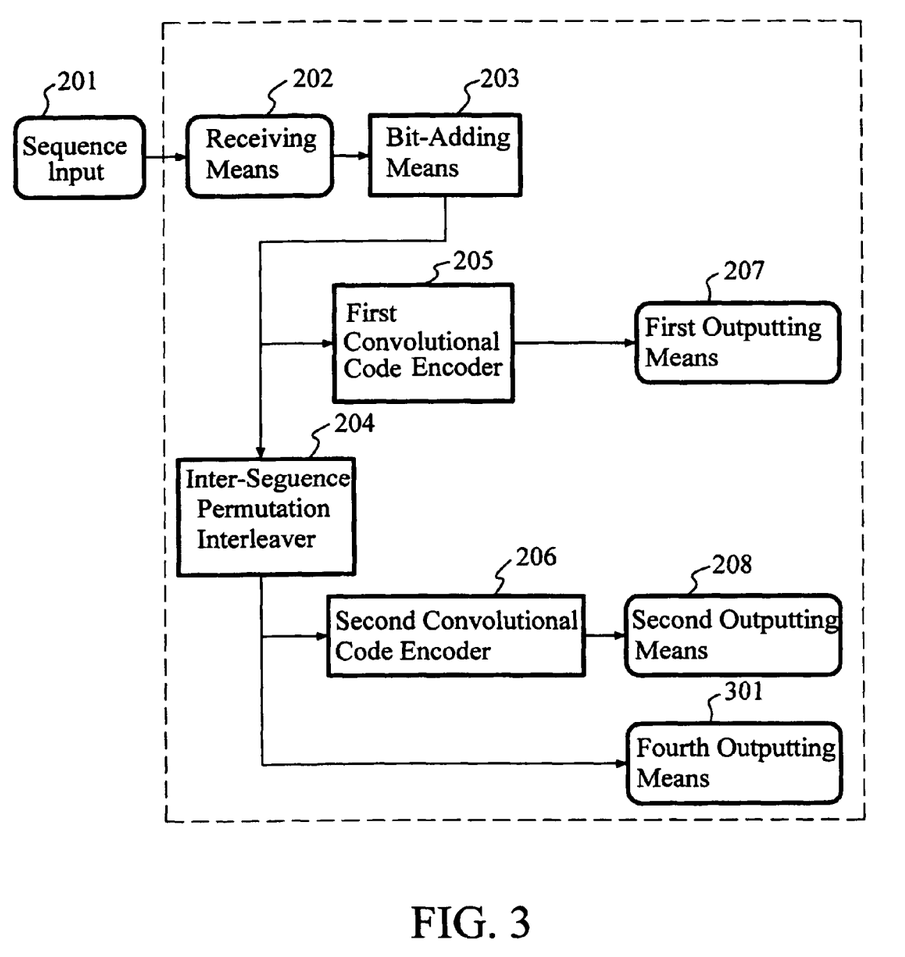
FIG. 3 shows a second embodiment of the ISP encoder of the present invention.
Figure 4:
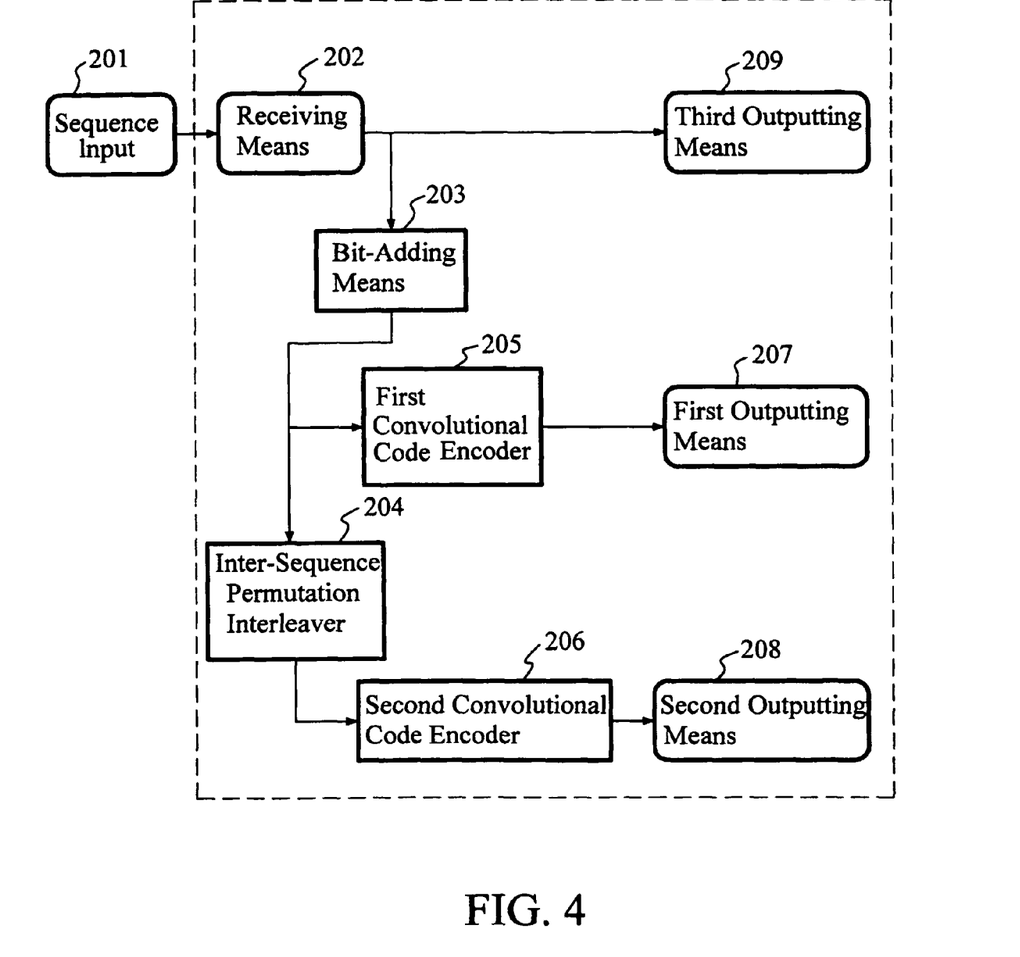
FIG. 4 shows a third embodiment of the ISP encoder of the present invention.

The techniques described in previous 2 paragraphs and FIG. 1 can be embodied in U.S. application Ser. No. 11/176,829 and U.S. application Ser. No. 11/414,433 in various ways shown as follows. In FIGS. 2-4, receiving means and outputting means indicate physical portions for receiving and outputting sequences, respectively. They can be devices, circuit blocks, terminals, contacts, or simply wire junctions.

FIG. 2 is a first embodiment of the present invention, which evolves from FIG. 2 of U.S. application Ser. No. 11/176,829 by choosing outputs 106, 107 and 108 in FIG. 2 of U.S. application Ser. No. 11/176,829. In U.S. application Ser. No. 11/176,829, only three outputs (106, 107, 108, or 107, 108, 109) are required.

In FIG. 2, a bit-adding means 203 adds bits to an information bit sequence input received from a receiving means 202. After processed by the ISP encoder, every code bit sequence output at the first outputting means 207, second outputting means 208, and third outputting means 209 is subjected to a deleting operation in order to eliminate the "added" or "punctured" bits. As mentioned before, at least an additional puncturing operation can be further performed on the code bit sequence output in order to increase the bandwidth efficiency.

In FIG. 3, similarly every code bit sequence output at the first outputting means 207, second outputting means 208, and fourth outputting means 301 is subjected to a deleting operation in order to eliminate the "added" bits. As mentioned before, at least an additional puncturing operation can be further performed on the code bit sequence output in order to increase the bandwidth efficiency.

In FIG. 4, the third outputting means is directly coupled to the receiving means 202, thus eliminating the need to perform the deleting operation at the third outputting means 209. Similarly, every code bit output at the first outputting means 207 and second outputting means 208 is still subjected to a deleting operation in order to eliminate the "punctured" bits. As mentioned before, at least an additional puncturing operation can be further performed on the code bit sequence output in order to increase the bandwidth efficiency.

Figure 5:
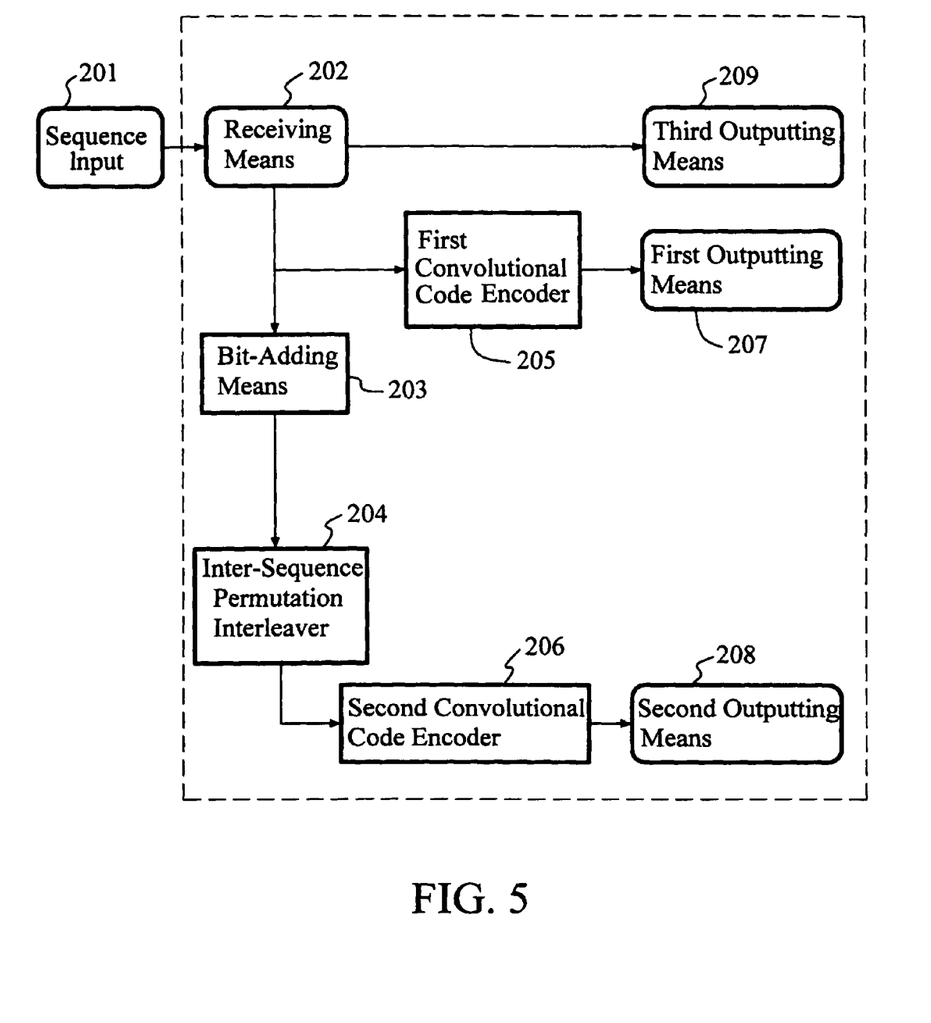
FIG. 5 shows a fourth embodiment of the ISP encoder of the present invention.
Figure 6:
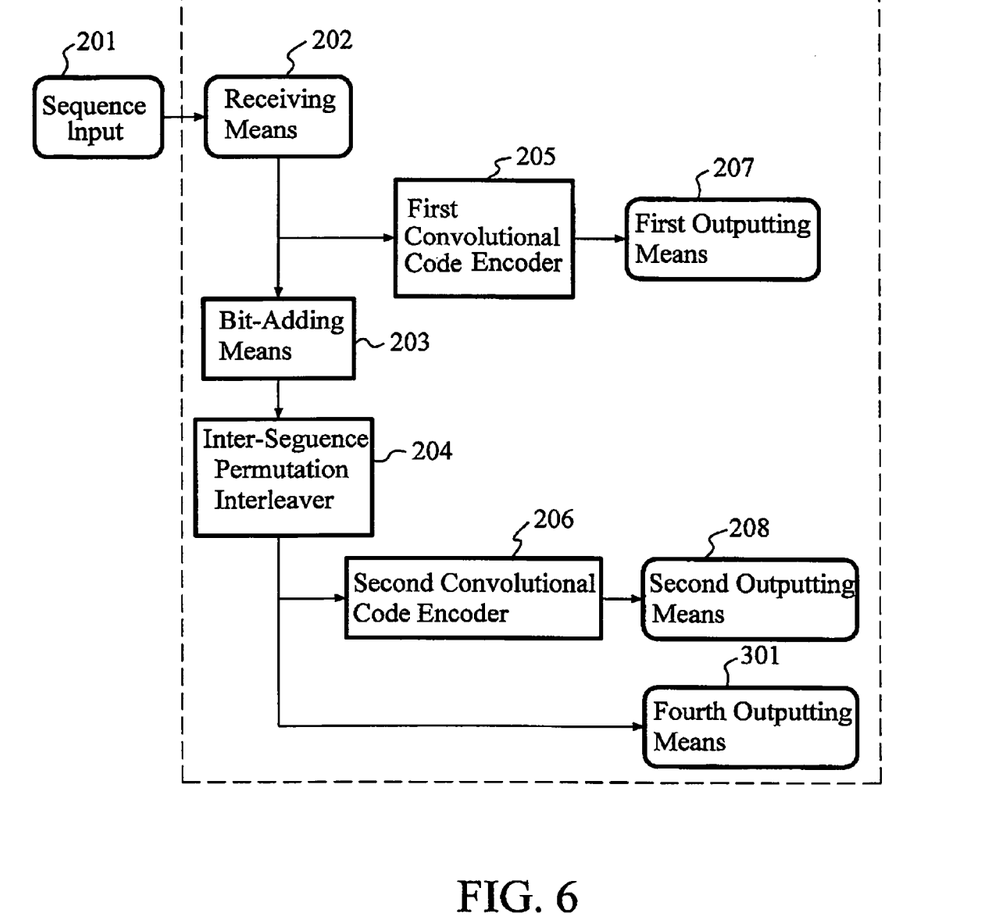
FIG. 6 shows a fifth embodiment of the ISP encoder of the present invention.

Encoders shown in FIG. 5 and FIG. 6 are similar to those in FIG. 4 and FIG. 3, respectively. A difference lies in that the first convolutional code encoder 205 directly receives sequences from the receiving means 202, since not all methods of convolutional code encoding requires "shortening" or "puncturing" beforehand. As mentioned before, at least an additional puncturing operation can be further performed on the code bit sequence output in order to increase the bandwidth efficiency.

In FIG. 2, FIG. 3, FIG. 4, FIG. 5, and FIG. 6, the first and second convolutional code encoders can adopt as least one of the following methods: tail-biting convolutional encoding, tail-padding convolutional code encoding. The convolutional code encoders can be replaced by other encoding methods such as Reed-Muller code, BCH code . . . etc. Multiple sequences after and before inter-sequence permutation interleaver can be separately encoded.

Naturally, an individual who fully understand the present invention could realize that in fact, only sequences passing through the inter-sequence permutation interleaver requires "shortening" or "puncturing" operations. Therefore, the deleting operations do not require to be only performed at the outputting means. They can be performed right following the inter-sequence permutation interleaver, or prior to a convolutional code encoder if sequences passing through that convolutional code encoder do not require "shortening" or "puncturing."

The almost regular permutation is also a kind of inter-sequence permutation interleaver and the "shortening" or "puncturing" can be applied for the turbo code applying the almost regular permutation as interleaver to encode a bit sequence with variable length.

What is claimed is:

1. An inter-sequence permutation encoder, at least comprising:
   a receiving means for receiving an information bit sequence input;
   a first outputting means for outputting a first code bit sequence output;
   a second outputting means for outputting a second code bit sequence output;
   a bit-adding means coupled to the receiving means, wherein the bit-adding means processing the received information bit sequence input prior to any subsequent processing of the received information bit sequence input in the inter-sequence permutation encoder;
   a first convolutional code encoder coupled between the bit-adding means and the first outputting means; and
   a second convolutional code encoder coupled to the second outputting means; and
   an inter-sequence permutation interleaver coupled between the bit-adding means and the second convolutional code encoder,
   wherein the first and second convolutional code encoders perform as least one of the following methods: tail-biting convolutional encoding, tail-padding convolutional code encoding.

2. The inter-sequence permutation encoder as claimed in claim 1, further comprising a third outputting means coupled to the bit-adding means to output a third code bit sequence output.

3. The inter-sequence permutation encoder as claimed in claim 2, wherein the third outputting means performs a deleting operation in order to eliminate bits added by the bit-adding means.

4. The inter-sequence permutation encoder as claimed in claim 3, wherein the third code bit sequence output undergoes at least an additional puncturing operation.

5. The inter-sequence permutation encoder as claimed in claim 2, wherein the third code bit sequence output undergoes at least an additional deleting operation.

6. The inter-sequence permutation encoder as claimed in claim 1, further comprising a third outputting means coupled to the receiving means to output a third code bit sequence output.

7. The inter-sequence permutation encoder as claimed in claim 6, wherein the third code bit sequence output undergoes at least an additional deleting operation.

8. The inter-sequence permutation encoder as claimed in claim 1, further comprising a fourth outputting means coupled to the inter-sequence permutation interleaver to output a fourth code bit sequence output.

9. The inter-sequence permutation encoder as claimed in claim 8, wherein the fourth outputting means performs a deleting operation in order to eliminate bits added by the bit-adding means.

10. The inter-sequence permutation encoder as claimed in claim 9, wherein the fourth code bit sequence output undergoes at least an additional puncturing operation.

11. The inter-sequence permutation encoder as claimed in claim 8, wherein the fourth code bit sequence output undergoes at least an additional deleting operation.

12. The inter-sequence permutation encoder as claimed in claim 1, wherein methods adopted by the convolutional code encoders are replaced by at least one of the following methods: Reed-Muller code and BCH code.

13. The inter-sequence permutation encoder as claimed in claim 12, wherein the first or second code bit sequence output undergoes at least an additional puncturing operation.

14. The inter-sequence permutation encoder as claimed in claim 12, wherein the first code bit sequence output undergoes at least an additional puncturing operation.

15. The inter-sequence permutation encoder as claimed in claim 12, wherein the second code bit sequence output undergoes at least an additional puncturing operation.

16. The inter-sequence permutation encoder as claimed in claim 1, wherein sequences processed after and before the inter-sequence permutation interleaver are separately encoded.

17. The inter-sequence permutation encoder as claimed in claim 1, wherein the first and second outputting means perform deleting operations in order to eliminate bits added by the bit-adding means.

18. The inter-sequence permutation encoder as claimed in claim 1, wherein the first and second code bit sequence outputs undergo at least an additional puncturing operation.

19. The inter-sequence permutation encoder as claimed in claim 1, wherein the second outputting means performs deleting operations in order to eliminate bits added by the bit-adding means.

20. The inter-sequence permutation encoder as claimed in claim 1, wherein the first outputting means performs deleting operations in order to eliminate bits added by the bit-adding means.

21. The inter-sequence permutation encoder as claimed in claim 1, wherein the first code bit sequence output undergoes at least an additional puncturing operation.

22. The inter-sequence permutation encoder as claimed in claim 1, wherein the second code bit sequence output undergoes at least an additional puncturing operation.

23. An inter-sequence permutation encoder, at least comprising:
a receiving means for receiving an information bit sequence input;
a first outputting means for outputting a first code bit sequence output;
a second outputting means for outputting a second code bit sequence output;
a bit-adding means coupled to the receiving means, wherein the bit-adding means processes the received information bit sequence input prior to any subsequent processing of the received information bit sequence input in the inter-sequence permutation encoder;
a first convolutional code encoder coupled between the receiving means and the first outputting means;
a second convolutional code encoder coupled to the second outputting means; and
an inter-sequence permutation interleaver coupled between the bit-adding means and the second convolutional code encoder,
wherein the first and second convolutional code encoders perform as least one of the following methods: tail-biting convolutional encoding, tail-padding convolutional code encoding.

24. The inter-sequence permutation encoder as claimed in claim 23, further comprising a third outputting means coupled to the receiving means to output a third code bit sequence output.

25. The inter-sequence permutation encoder as claimed in claim 24, wherein the third code bit sequence output undergoes at least an additional puncturing operation.

26. The inter-sequence permutation encoder as claimed in claim 23, further comprising a fourth outputting means coupled to the inter-sequence permutation interleaver to output a fourth code bit sequence output.

27. The inter-sequence permutation encoder as claimed in claim 26, wherein the fourth outputting means performs a deleting operation in order to eliminate bits added by the bit-adding means.

28. The inter-sequence permutation encoder as claimed in claim 27, wherein the fourth code bit sequence output undergoes at least an additional puncturing operation.

29. The inter-sequence permutation encoder as claimed in claim 23, wherein methods adopted by the convolutional code encoders are replaced by at least one of the following methods: Reed-Muller code and BCH code.

30. The inter-sequence permutation encoder as claimed in claim 23, wherein sequences processed after and before the inter-sequence permutation interleaver are separately encoded.

31. The inter-sequence permutation encoder as claimed in claim 23, wherein the second outputting means performs a deleting operation in order to eliminate bits added by the bit-adding means.

32. The inter-sequence permutation encoder as claimed in claim 31, wherein the first or second code bit sequence output undergoes at least an additional puncturing operation.

33. The inter-sequence permutation encoder as claimed in claim 31, wherein the first code bit sequence output undergoes at least an additional puncturing operation.

34. The inter-sequence permutation encoder as claimed in claim 31, wherein the second code bit sequence output undergoes at least an additional puncturing operation.

\* \* \* \* \*